United States Patent
Teo et al.

(10) Patent No.: US 8,921,193 B2
(45) Date of Patent: Dec. 30, 2014

(54) PRE-GATE DIELECTRIC PROCESS USING HYDROGEN ANNEALING

(75) Inventors: Jocelyn Wei-Yee Teo, Singapore (SG); Chi-Chun Chen, Kaohsiung (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1420 days.

(21) Appl. No.: 11/333,399

(22) Filed: Jan. 17, 2006

(65) Prior Publication Data

US 2007/0166904 A1    Jul. 19, 2007

(51) Int. Cl.
*H01L 21/336* (2006.01)
*H01L 21/00* (2006.01)
*H01L 21/8238* (2006.01)

(52) U.S. Cl.
CPC ...... *H01L 21/823807* (2013.01); *H01L 21/823828* (2013.01); *H01L 21/823857* (2013.01)
USPC .......................................... 438/308; 438/795

(58) Field of Classification Search
USPC ................................................ 438/308, 795
See application file for complete search history.

(56) References Cited

U.S. PATENT DOCUMENTS

| | | | |
|---|---|---|---|
| 5,248,893 A | 9/1993 | Sakamoto | |
| 5,883,396 A | 3/1999 | Reedy et al. | |
| 6,160,287 A | 12/2000 | Chang | |
| 6,251,751 B1 | 6/2001 | Chu et al. | |
| 6,281,532 B1 * | 8/2001 | Doyle et al. | 257/288 |
| 6,342,421 B1 | 1/2002 | Mitani et al. | |
| 6,570,217 B1 | 5/2003 | Sato et al. | |
| 6,573,172 B1 | 6/2003 | En et al. | |
| 6,683,364 B2 | 1/2004 | Oh et al. | |
| 6,690,062 B2 | 2/2004 | Henninger et al. | |
| 6,870,179 B2 | 3/2005 | Shaheed et al. | |
| 7,355,262 B2 * | 4/2008 | Ko et al. | 257/506 |
| 2001/0045597 A1 | 11/2001 | Nishinohara | |
| 2002/0005529 A1 * | 1/2002 | Horita et al. | 257/200 |
| 2002/0072197 A1 * | 6/2002 | Kang et al. | 438/424 |
| 2002/0191458 A1 * | 12/2002 | Kobayashi et al. | 365/200 |
| 2003/0114000 A1 * | 6/2003 | Noguchi | 438/687 |
| 2004/0104405 A1 | 6/2004 | Huang et al. | |
| 2005/0062080 A1 * | 3/2005 | Nakamura et al. | 257/288 |
| 2005/0167750 A1 * | 8/2005 | Yang et al. | 257/347 |
| 2006/0001108 A1 * | 1/2006 | Yamamoto | 257/395 |

(Continued)

OTHER PUBLICATIONS

"Rounded" dictionary entry, Merriam-Webster Dictionary (2008).*

(Continued)

*Primary Examiner* — Kevin Parendo
(74) *Attorney, Agent, or Firm* — Slater & Matsil, L.L.P.

(57) ABSTRACT

The preferred embodiment of the present invention provides a novel method of forming MOS devices using hydrogen annealing. The method includes providing a semiconductor substrate including a first region and a second region, forming at least a portion of a first MOS device covering at least a portion of the first active region, performing a hydrogen annealing in an ambient containing substantially pure hydrogen on the semiconductor substrate. The hydrogen annealing is performed after the step of the at least a portion of the first MOS device is formed, and preferably after a pre-oxidation cleaning. The method further includes forming a second MOS device in the second active region after hydrogen annealing. The hydrogen annealing causes the surface of the second active region to be substantially rounded, while the surface of the first active region is substantially flat.

21 Claims, 4 Drawing Sheets

(56) References Cited

U.S. PATENT DOCUMENTS

2006/0008961 A1* 1/2006 Lee et al. ............ 438/197
2006/0033144 A1 2/2006 Forbes et al.
2006/0091482 A1 5/2006 Kim et al.

OTHER PUBLICATIONS

Yang, F.-L., et al., "5nm-Gate Nanowire FinFET," 2004 Symposium on VLSI Technology Digest of Technical Papers, IEEE, pp. 196-197.

Sato, T., et al., "Trench Transformation Technology Using Hydrogen Annealing for Realizing Highly Reliable Device Structure with Thin Dielectric Films," 1998 Symposium on VLSI Technology Digest of Technical Papers, IEEE, pp. 206-207.

Matsuda, S., et al., "Novel Corner Rounding Process for Shallow Trench Isolation Utilizing MSTS (Micro-Structure Transformation of Silicon)," IEDM, 1998, pp. 137-140.

Yang, H.S., et al., "Dual Stress Liner for High Performance sub-45nm Gate Length SOI CMOS Manufacturing," IEDM, 2004, pp. 1075-1077.

Ge, C.-H., et al., "Process-Strained Si (PSS) CMOS Technology Featuring 3D Strain Engineering," IEDM, 2003, pp. 73-76.

Sato, T., et al., "Micro-Structure Transformation of Silicon: A Newly Developed Transformation Technology for Patterning Silicon Surfaces Using the Surface Migration of Silicon Atoms by Hydrogen Annealing," Japanese Journal of Applied Physics, vol. 39, Part 1, No. 9A, Sep. 2000, pp. 5033-5038.

* cited by examiner

PRE-GATE DIELECTRIC PROCESS USING HYDROGEN ANNEALING

CROSS-REFERENCE TO RELATED APPLICATIONS

This application relates to commonly assigned U.S. patent application Ser. No. 11/378,907, filed Mar. 17, 2006, entitled "Diffusion Topography Engineering for High Performance CMOS Fabrication," and subsequently granted U.S. Pat. No. 7,355,262 on Apr. 8, 2008, which patent is incorporated herein by reference.

TECHNICAL FIELD

This invention relates generally to structure and fabrication methods of metal-oxide-semiconductor (MOS) devices, and more particularly to device mobility improvement through pre-gate processes.

BACKGROUND

With scaling of VLSI circuits, more devices are put into a chip. This not only requires the shrinking of the device size, but it also puts higher requirements on each component of the semiconductor devices.

Reducing equivalent oxide thickness (EOT) of a gate dielectric is important for a metal-oxide-semiconductor (MOS) device to have high performance. Many methods have been explored to reduce the EOT of the gate dielectric. However, when the EOT of a MOS device is reduced, leakage current often increases. Conventionally, this problem is solved by incorporating nitrogen into the gate dielectrics.

The incorporation of nitrogen into the gate dielectrics, however, comes with cost. The carrier mobility of the MOS device is reduced due to the introduction of nitrogen. The drive current of the MOS device is thus reduced, which partially offsets the benefit of the improvement of the equivalent oxide thickness. Among various approaches to compensate for the carrier mobility degradation, rounding the surface of the active regions on which MOS devices are formed is commonly used. As a result, more nitrogen can be introduced (if necessary) into the gate dielectric without concern for reduction of the carrier mobility, so that the performance of the MOS devices can be better adjusted.

In conventional integrated circuit manufacturing processes, surface rounding is performed after the formation of shallow trench isolation regions, and all exposed active regions on a wafer are rounded, including those non-core device regions, which typically do not need to be rounded. This may cause unexpected (adverse) effects on devices formed in those regions. There is the need, therefore, for an improved manufacturing method that restricts the rounding effects locally.

SUMMARY OF THE INVENTION

The preferred embodiment of the present invention provides a novel method of forming MOS devices using hydrogen annealing.

In accordance with one aspect of the present invention, a preferred method embodiment includes providing a semiconductor substrate, forming at least one portion of a first MOS device in a first active region in the semiconductor substrate, performing an annealing step in an ambient containing substantially pure hydrogen on the semiconductor substrate after the at least one portion of the first MOS device is formed. The hydrogen annealing is preferably performed after pre-oxidation cleaning. The method further includes forming a second MOS device in a second active region in the semiconductor substrate after the step of performing the hydrogen annealing.

In accordance with another aspect of the present invention, the hydrogen annealing is preferably performed after the formation of the gate dielectric but before the formation of the gate electrode of the first MOS device. Alternatively, the hydrogen annealing may be performed after the formation of the gate electrode of the first MOS device, or after the formation of the spacers of the second MOS device, etc.

In accordance with yet another aspect of the present invention, a semiconductor structure formed using the preferred method embodiment includes a substrate comprising a first and a second active region, wherein the first active region has a substantially flat surface and the second active region has a substantially round surface. A first and a second MOS device are formed in the first and second active regions, respectively.

In accordance with yet another aspect of the present invention, the second active region is preferably a core device region, and the first active region is preferably a non-core device region, such as an input/output device region, a high-voltage device region, and the like.

The advantageous features of the preferred embodiments of the present invention includes restricting hydrogen annealing in desired regions, so that device performance in other regions are not adversely affected. Devices in certain regions, such as in core device regions, can have an improved performance and reliability, while the carrier mobility is maintained.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
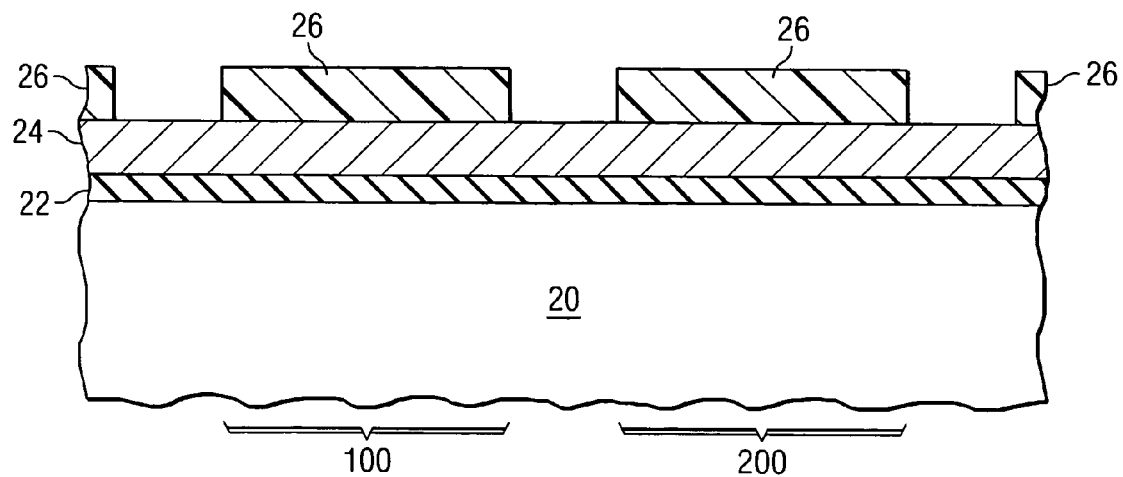
FIGS. 1 through 9 are cross-sectional views of intermediate stages in the manufacture of a preferred embodiment.

FIGS. 1 through 9 illustrate intermediate stages in the manufacture of the preferred embodiments of the present invention. Throughout the various views and illustrative embodiments of the present invention, like reference numbers are used to designate like elements. Referring to FIG. 1, a substrate 20 and a starting structure for the formation of shallow trench isolation regions are shown. In the preferred embodiment, the substrate 20 is a bulk silicon substrate. In other embodiments, the substrate 20 comprises silicon, germanium, carbon, and combinations thereof. In yet other embodiments, the substrate 20 has a silicon-on-insulator structure.

The substrate 20 includes at least two active regions 100 and 200. In the preferred embodiment, the device region 100 is a core device region comprising core devices, and the active region 200 is preferably a non-core device region, such as a peripheral region. Examples of the active region 200 include an input/output device region, a high-voltage device region, and the like.

A pad layer 22 and a hard mask layer 24 are formed over the substrate 20. The pad layer 22 is preferably a thin film formed through a thermal process, and is preferably used for reducing the stress between the substrate 20 and the subsequently formed mask layer 24. Preferably, the hard mask layer 24 is formed of silicon nitride using low-pressure chemical vapor deposition (LPCVD). Alternatively, the hard mask layer 24 is formed by thermal nitridation or plasma anodic nitridation of silicon using nitrogen. A photo resist 26 is then formed and patterned over the mask layer 24.

Figure 2:
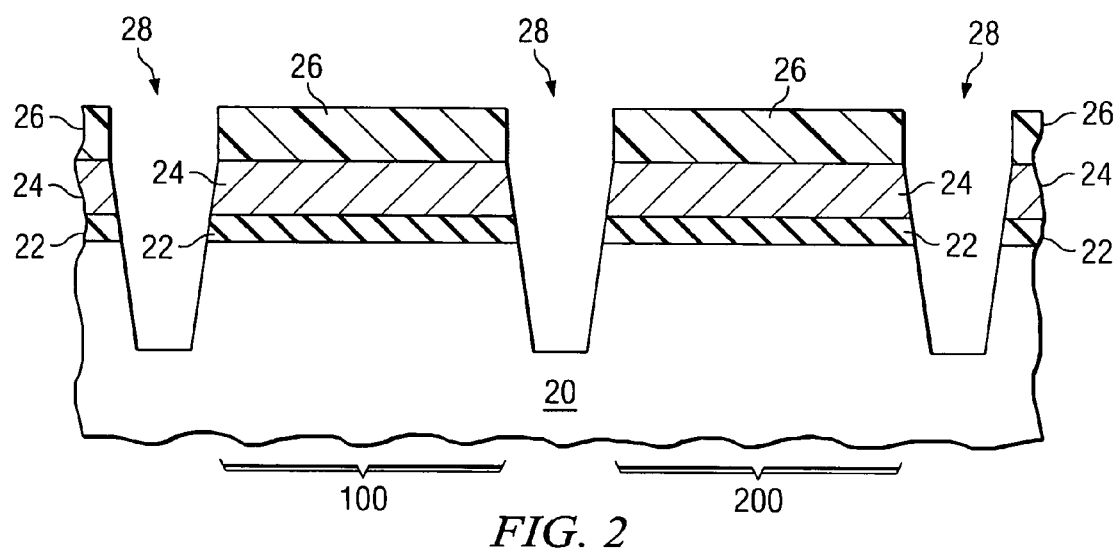
Figure 3:
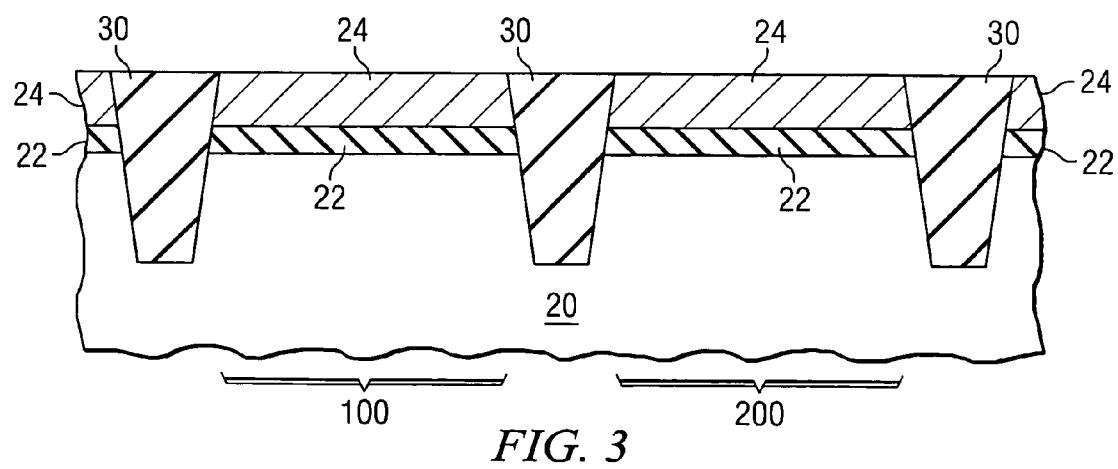

Trenches 28 are formed, as shown in FIG. 2, preferably by anisotropic plasma etching using fluorine-containing chemicals. The photo resist 26 is then removed. In the preferred embodiment, trenches 28 are filled with a dielectric material, preferably silicon oxide formed by high-density plasma (HDP). In other embodiments, a combination of trench-filling materials, such as a combination of silicon oxide and polysilicon both formed using chemical vapor deposition (CVD), can be used. A chemical mechanical polish is then performed to planarize the surface of the wafer, forming shallow trench isolation (STI) regions 30, and the resulting structure is shown in FIG. 3. The STI regions 30 separate the active regions 100 and 200.

Figure 4:
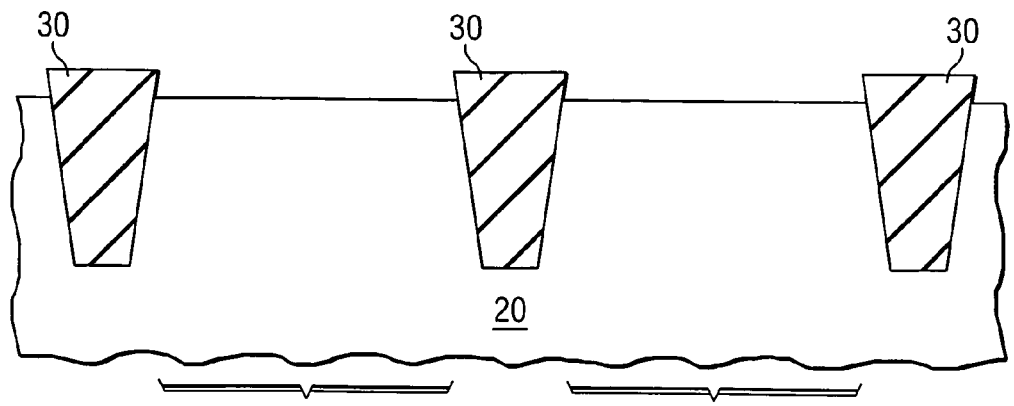

FIG. 4 illustrates the removal of the pad layer 22 and hard mask layer 24. Preferably, the hard mask layer 24 is removed by etching in phosphoric acid. The pad oxide 22 is preferably stripped using diluted hydrofluoric acid. It is to be noted that the top surfaces of the STI regions 30 may be higher than the top surface of the substrate 20. In subsequent cleaning processes, the top surfaces of the STI regions 30 will be lowered. For simplicity purposes, the height difference between the top surfaces of the STI regions 30 and the substrate 20 is not shown in scale.

Figure 5:
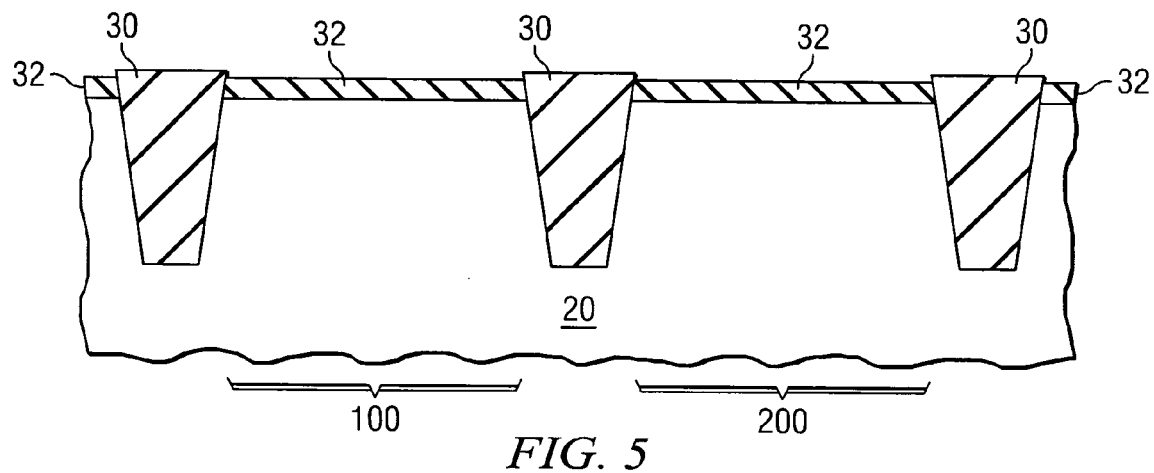

FIG. 5 illustrates the formation of a gate dielectric layer 32. In the preferred embodiment, the gate dielectric layer 32 comprises silicon oxide formed by a thermal growth technique in a wet or dry environment, or by a chemical vapor deposition (CVD) technique such as low temperature CVD (LTCVD), low pressure CVD (LPCVD), plasma enhanced CVD (PECVD), etc. In other embodiments, it comprises silicon nitride, silicon oxynitride or other nitrogen-containing dielectrics, and may have an oxide-nitride-oxide (ONO) structure.

Figure 6:
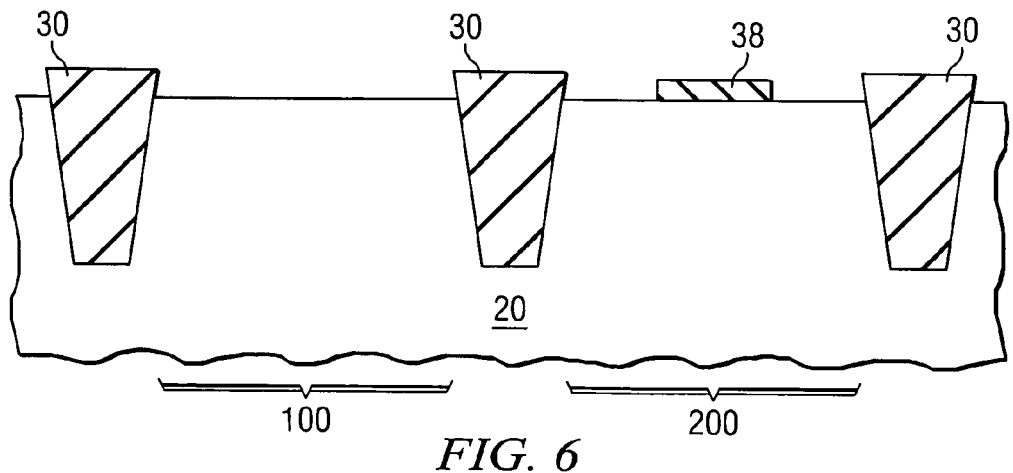

The gate dielectric layer 32 is patterned to form a gate dielectric 38 in region 200, as shown in FIG. 6. A pre-oxidation cleaning is performed to clean the surfaces of the semiconductor substrate 20, preparing it for the formation of a gate dielectric. A hydrogen annealing is then performed, preferably in an ambient containing substantially pure hydrogen. The preferred hydrogen pressure is preferably less than about 20 Torr. The temperature of the hydrogen annealing is preferably greater than about 900 degrees Celsius.

The hydrogen annealing may be performed using methods such as thermal annealing, flash annealing, laser annealing, and the like. The duration of the annealing depends on the method of annealing.

Figure 7A:
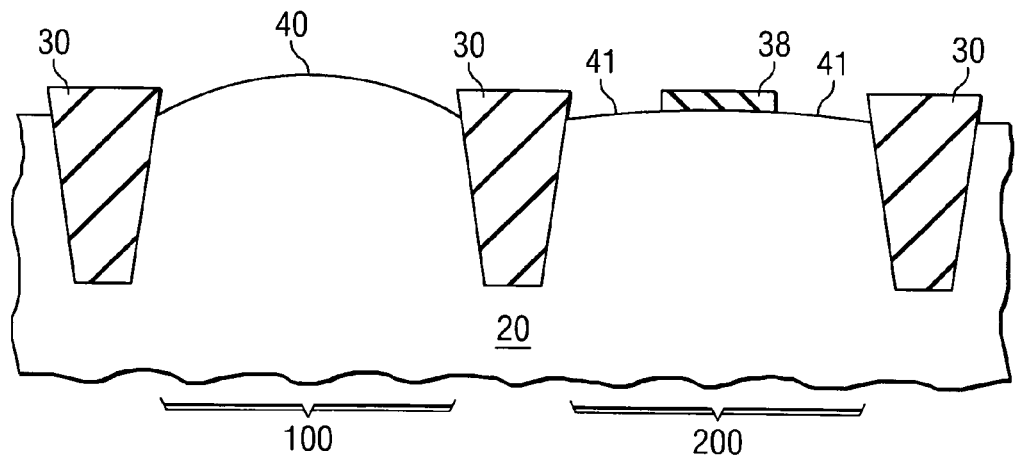

Due to the hydrogen annealing, the silicon atoms migrate, so that the surface 40 in the active region 100 has a convex surface with curvature, as illustrated in FIG. 7A. In one exemplary embodiment, the convex surface is substantially rounded. The curvature of the surface 40 is a preferred feature since it introduces beneficial strain to the channel region of the MOS device formed thereon, thus improving the carrier mobility. As a result, the drive current of the MOS device is improved. Depending on the widths of the isolation separation regions or the active regions, this curvature or the extent of the curvature varies. Typically, an active region having a small length tends to have greater curvature after the hydrogen annealing. This is a desired phenomenon, as it is easier to form curved surfaces when MOS devices become smaller. Also, the highest point of the active region 100, which is substantially close to the center point of the active region 100, is higher than the lowest point, which is substantially close to one of the STI regions 30.

The roundness of the surface 40 of the region 100 is affected by various factors, such as the composition of the semiconductor substrate 20 and the length L of the active region 100. Different temperatures, hydrogen pressures and anneal durations may be required to form rounded surface 40 with a desired curvature. One skilled in the art can find suitable temperatures, pressures and anneal durations through routine experiments.

Figure 7B:
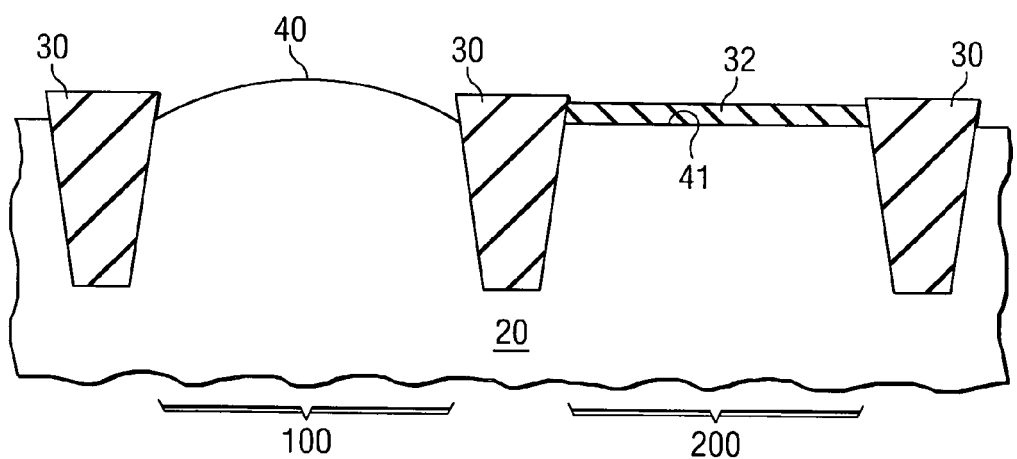
Figure 7C:
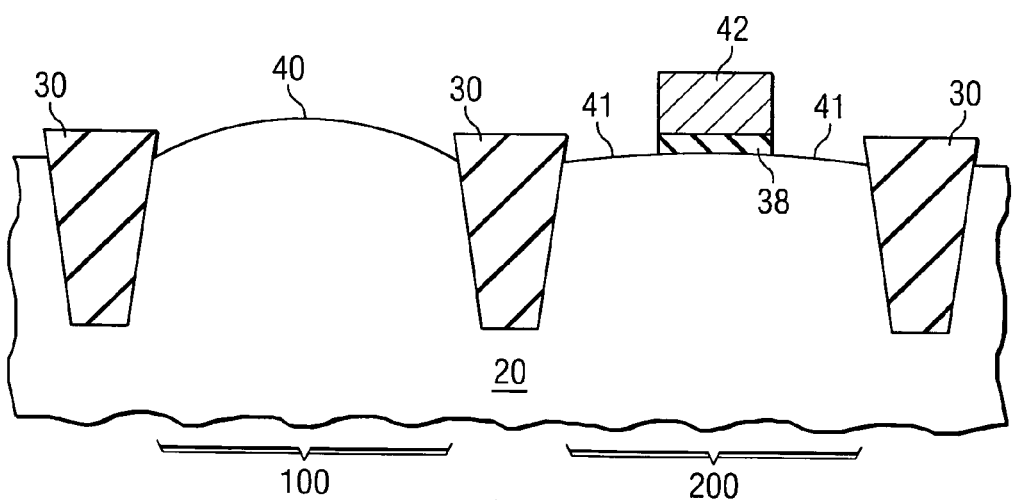

Due to the masking of the gate dielectric 38, surface 41 of semiconductor substrate 20 in region 200 is relatively flat compared to the uncovered surface 40. Preferably, surface 41 is substantially flat. In the preferred embodiment as shown in FIG. 7A, wherein the hydrogen annealing is performed after the gate dielectric 38 is patterned, the substantially flat surface 41 of the semiconductor substrate 20 may be slightly curved. In other embodiments, as shown in FIG. 7B, the hydrogen annealing is performed before the patterning of the gate dielectric layer 32 to form a gate dielectric, and the gate dielectric layer 32 covers the entire active region 200. After hydrogen annealing, surface 41 of active region 200 is flat. In yet other embodiments, hydrogen annealing is performed after the formation of a gate electrode 42 in the active region 200, as shown in FIG. 7C. In this case, the surface 41 is substantially flat, although a slight curvature may exist.

Figure 8:
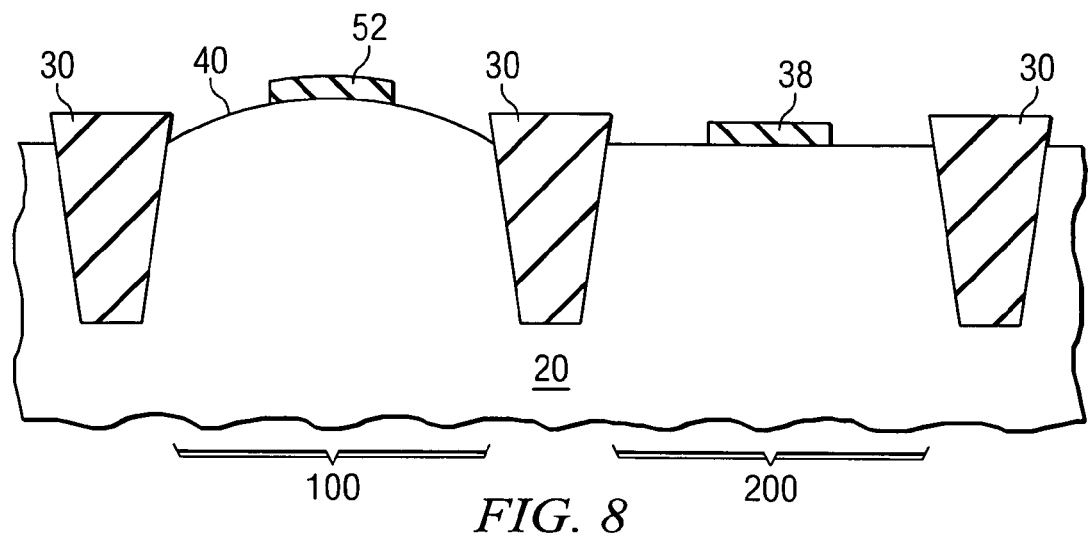

FIG. 8 illustrates the formation of a gate dielectric 52 over the surface 40 in active region 100. The gate dielectric 52 preferably has a high k value, and preferably comprises a nitrogen-containing material, such as silicon nitride, silicon oxynitride, and the like. Methods for forming the gate dielectric 52 include LPCVD, thermal nitridation of silicon, plasma nitridation of silicon, and the like. Preferably, the gate dielectric 52 has a thickness less than the thickness of the gate dielectric 38.

Figure 9:
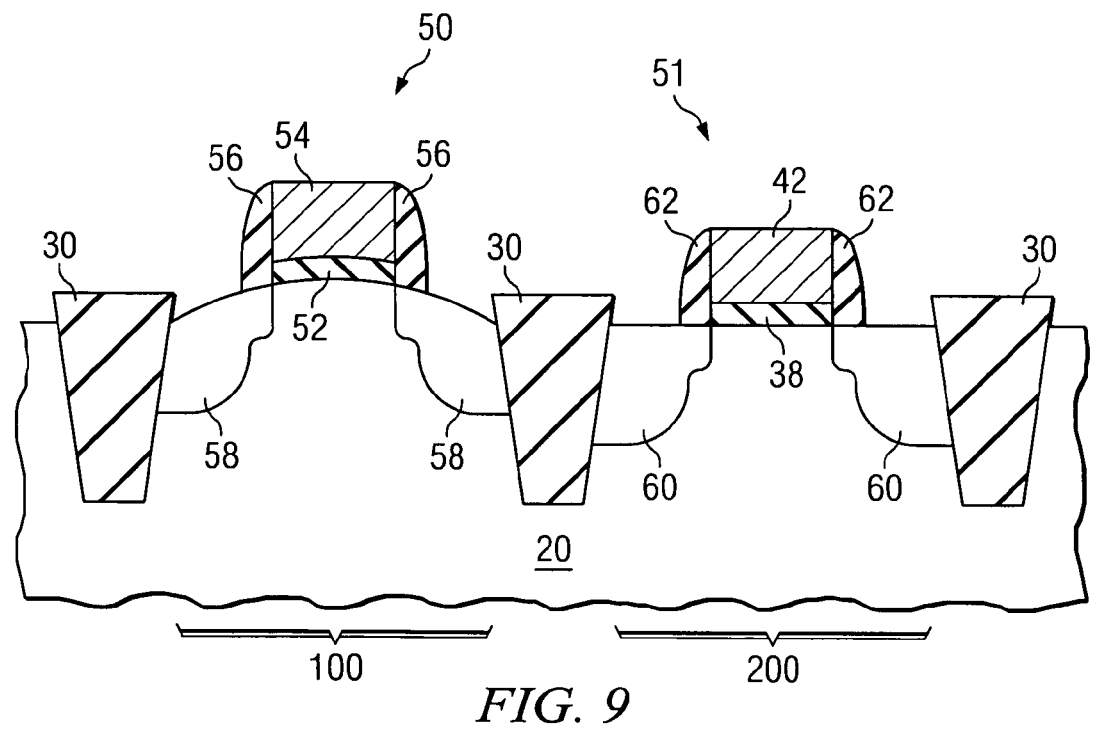

FIG. 9 illustrates the continued formation of MOS devices 50 and 51 in the active regions 100 and 200, respectively. The MOS device 50 comprises the gate dielectric 52, a gate electrode 54, spacers 56 and source/drain regions 58. The MOS device 51 comprises the gate dielectric 38, a gate electrode 42, spacers 62 and source/drain regions 60. The formation of these components is well known in the art, and thus is not repeated herein.

In previously discussed embodiments, the hydrogen annealing is performed after the pre-oxidation cleaning, which is preferably performed after the formation of the gate dielectric 38. Alternatively, the pre-oxidation cleaning and hydrogen annealing can be performed any time after the formation of the gate dielectric 32. Also, the components of the MOS devices 50 and 51 can be formed simultaneously or separately. For example, each pair of the gate electrodes 40 and 54, the spacers 56 and 62, and source/drain regions 58 and 60 may be formed simultaneously using the same processes, or separately using different processes and/or different materials, depending on the design requirement.

The preferred embodiments of the present invention have several advantageous features. Masking at least a portion of the active region 200 during hydrogen annealing ensures that the surface rounding of the device region 100 is locally restricted and does not affect other device regions. Carrier mobility is improved, increasing the feasibility of incorporating more nitrogen into the gate dielectric. In addition, the preferred embodiments of the present invention are fully compatible with conventional MOS device manufacturing processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
    forming trench isolation regions extending from a top surface of a semiconductor substrate into the semiconductor substrate, wherein the trench isolation regions define a first active region and a second active region;
    forming a first gate dielectric over the semiconductor substrate in the first active region;
    forming a convex surface of the top surface of the semiconductor substrate in the second active region by performing a hydrogen anneal on the semiconductor substrate in an ambient containing hydrogen while the top surface of the semiconductor substrate in the second active region is exposed, the convex surface being between a first source/drain region of the second active region and a second source/drain region of the second active region, a curvature of the convex surface being convex in a direction from the first source/drain region to the second source/drain region; and
    forming a second gate dielectric over the convex surface in the second active region.

2. The method of claim 1, wherein the ambient contains substantially pure hydrogen.

3. The method of claim 1, wherein the hydrogen anneal is performed at a temperature of higher than about 900 degrees Celsius.

4. The method of claim 1, wherein the hydrogen anneal is performed at a hydrogen pressure of less than about 20 Torr.

5. The method of claim 1, wherein, after the hydrogen anneal, the top surface of the semiconductor substrate in the second active region has a center portion higher than an edge portion.

6. The method of claim 1, wherein the hydrogen anneal is performed between the forming the first gate dielectric and forming a gate electrode in the first active region.

7. The method of claim 1, wherein the hydrogen anneal is performed after forming a first gate electrode in the first active region.

8. The method of claim 1 further comprising the steps of:
    forming a first gate electrode on the first gate dielectric;
    forming a first spacer on a sidewall of the first gate electrode;
    forming a third source/drain region and a fourth source/drain region on opposite sides of the first gate dielectric;
    forming a second gate electrode on the second gate dielectric;
    forming a second spacer on a sidewall of the second gate electrode; and
    forming the first source/drain region and the second source/drain region on opposite sides of the second gate dielectric.

9. The method of claim 8, wherein the first spacer and the second spacer are formed simultaneously.

10. The method of claim 8, wherein the first source/drain region, the second source/drain region, the third source/drain region, and the fourth source/drain region are formed simultaneously.

11. The method of claim 8, wherein the convex surface comprises an entirety of the top surface of the semiconductor substrate in the second active region between the first source/drain region and the second source/drain region.

12. The method of claim 1 further comprising performing a cleaning step to clean exposed portions of the semiconductor substrate after the forming the first gate dielectric and before the performing the hydrogen anneal.

13. The method of claim 1, wherein after the performing the hydrogen anneal, the convex surface of the top surface of the semiconductor substrate in the second active region increases in height from the first source/drain region to a portion of the semiconductor substrate underlying the second gate dielectric in the direction from the first source/drain region to the second source/drain region substantially monotonically and continuously.

14. The method of claim 1, wherein the curvature of the convex surface introduces a strain on the top surface of the semiconductor substrate in the second active region.

15. A method of forming a semiconductor structure, the method comprising:
    forming trench isolation regions extending from a top surface of a semiconductor substrate into the semiconductor substrate, wherein the trench isolation regions define a first active region and a second active region;
    after forming the trench isolation regions, forming a first gate dielectric over the semiconductor substrate in the first active region;
    forming a first gate electrode over the first gate dielectric;
    after the steps of forming the first gate dielectric and the first gate electrode, performing a hydrogen anneal on the semiconductor substrate in an ambient containing substantially pure hydrogen, wherein the top surface of the semiconductor substrate in the second active region forms a round surface having a curvature that extends from one trench isolation region across the entire second active region to another trench isolation region;
    after the step of performing the hydrogen anneal, forming a second gate dielectric over the round surface of the semiconductor substrate in the second active region such that the second gate dielectric is non-planar; and
    forming a second gate electrode over the second gate dielectric.

16. The method of claim 15, further comprising:
    forming a first source region and a first drain region on opposite sides of the first gate dielectric; and
    forming a second source region and a second drain region on opposite sides of the second gate dielectric.

17. The method of claim 16, wherein, after the step of performing the hydrogen anneal and the step of forming the second source region and the second drain region, a portion of the top surface of the semiconductor substrate in the second active region between the second source region and the second drain region has a convex surface.

18. The method of claim 16, wherein the hydrogen anneal is performed before the forming the second source region and the second drain region.

19. The method of claim 15 further comprising performing a cleaning step to clean exposed portions of the semiconductor substrate after the step of forming the first gate dielectric and before the step of performing the hydrogen anneal.

20. The method of claim 15, wherein after the step of performing the hydrogen anneal, the round surface of the second active region increases in height from portions closer to the trench isolation regions to portions closer to a center of the second active region substantially monotonically and continuously.

21. A method of forming a semiconductor structure, the method comprising:

forming trench isolation regions extending from a top surface of a semiconductor substrate into the semiconductor substrate, wherein the trench isolation regions define a first active region and a second active region;

forming a first gate dielectric over the semiconductor substrate in the first active region;

after forming the first gate dielectric, performing a hydrogen anneal on the semiconductor substrate in an ambient containing hydrogen while the top surface of the semiconductor substrate in the second active region is exposed, the hydrogen anneal rounding the top surface of the semiconductor substrate in the second active region between a first source/drain region of the second active region and a second source/drain region of the second active region, the rounding of the top surface of the semiconductor substrate in the second active region forming an arc of the top surface of the semiconductor substrate in a direction from the first source/drain region to the second source/drain region; and after performing the hydrogen anneal, forming a second gate dielectric over the top surface of the semiconductor substrate in the second active region, the second gate dielectric being disposed between the first source/drain region and the second source/drain region.

* * * * *